(12) United States Patent
Kim et al.

(10) Patent No.: US 6,621,114 B1
(45) Date of Patent: Sep. 16, 2003

(54) MOS TRANSISTORS WITH HIGH-K DIELECTRIC GATE INSULATOR FOR REDUCING REMOTE SCATTERING

(75) Inventors: Hyeon-Seag Kim, San Jose, CA (US); Joong Jeon, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/151,269

(22) Filed: May 20, 2002

(51) Int. Cl.[7] .............................................. H01L 27/108
(52) U.S. Cl. ...................................... 257/310; 438/290
(58) Field of Search ................................. 257/316, 300, 257/297, 310

(56) References Cited

U.S. PATENT DOCUMENTS

| | | | |
|---|---|---|---|
| 6,008,091 A | * 12/1999 | Gregor et al. | 438/261 |
| 6,177,311 B1 | * 1/2001 | Kauffman et al. | 438/257 |
| 6,246,076 B1 | * 6/2001 | Lipkin et al. | 257/77 |
| 6,504,214 B1 | * 1/2003 | Yu et al. | 257/347 |

OTHER PUBLICATIONS

"Characterizing Very Thin ONO Gates with Laser Spectroscopic Ellipsometry", Rudolph Technologies, Inc. Application Reports, reprinted from the Internet at: http://www.rudolphtech.com/reports/VeryThinONOGates.htm, Apr. 22, 2002, 3 pgs.

"Interface between c–Si and the High–k Dielectric HfO2: Characterization by Rotating Compensator Spectroscopic Ellipsometry (RCSE)", J. M. Leng, S. Li, J. L. Opsal, B. H. Lee and J. C. Lee, not dated, 3 pages.

"Epitaxially ideal oxide–semiconductor interfaces: Silicate adlayers on hexagonal (0001) and (0001) SiC surfaces", J. Bernhardt, J. Schart, U. Starke and K. Heinz, American Institute of Physics, vol. 74, No. 8, Feb. 22, 1999, 3pgs.

"Estimation of the Effects of Remote Charge Scattering on Electron Mobility of n–MOSFET's with Ultrathin Gate Oxides", Nian Yang, W. Kirklen Hensen, John R. Hauser and Jimmie J. Wortman, IEEE Transactions on Electron Devices, vol. 47, No. 2, Feb., 2000, 8 pages.

"MOSFET Transistors Fabricated with High Permitivity TiOs Dielectrics", Stephen A. Campbell, David C. Gilmer, Xiao–Chuan Wang, Ming–Ta Hsieh, Hyeon–Seag Kim, Wayne L Gladfelter and Jinhua Yan, IEEE Transactions on Electron Devices, vol. 44, No. 1, Jan. , 1997, 6 pgs.

"Limit of Gate Oxide Thickness Scaling in MOSFETs due to Apparent Threshold Voltage Fluctuation Induced by Tunnel Leakage Current", Meishoku Koh, Wataru Mizubayashi, Kunihiko Iwamoto, Hideki Murakami, Tsuyoshi Ono, Tatsuyoshi Mihara, Kentaro Shibahara and Masataka Hirose, IEEE Transactions on Electron Devices, vol. 48, No. 2, Feb., 2001, 6 pgs.

"Charge to Breakdown Mechanism of Thin ONO Films", Min Wha Park, Dae–Gwan Khang, Jung Suk Goo and Young–June Park, IEEE Transactions on Electron Devices, vol. 37, No. 11, Nov. 1990, pp. 2419–2422.

"High–Frequency Power Structures, SiGe HBYs Take the Spotlight", Ashok Bindra, Electronic Design, Dec. 6, 1999, Folume 47, No. 25, reprinted from the Internet at: http://www.elecdesign.com/1999/dec0699/ti/1206tip3.shtml.

* cited by examiner

*Primary Examiner*—David Nelms
*Assistant Examiner*—Thao P Le
(74) *Attorney, Agent, or Firm*—Eschweiler & Associates, LLC

(57) ABSTRACT

The present invention relates to a MOS transistor structure and method of manufacture which provides a high-k dielectric gate insulator for reduced gate current leakage while concurrently reducing remote scattering, thereby improving transistor carrier mobility.

14 Claims, 5 Drawing Sheets

US 6,621,114 B1

MOS TRANSISTORS WITH HIGH-K DIELECTRIC GATE INSULATOR FOR REDUCING REMOTE SCATTERING

FIELD OF THE INVENTION

The present invention relates generally to fabrication of field effect transistors having scaled-down dimensions, and more particularly, to a process for fabricating a transistor having a gate insulators which provide reduced leakage while improving carrier mobility by reducing scattering.

BACKGROUND OF THE INVENTION

A long-recognized important objective in the constant advancement of monolithic integrated circuit (IC) technology is the scaling-down of IC dimensions. Such scaling-down of IC dimensions reduces area capacitance and aids in obtaining higher speed performance of integrated circuits. Moreover, reducing the area of an IC die leads to higher yield in IC fabrication by providing more die per semiconductor wafer. Such advantages are a driving force to constantly scale down IC dimensions.

Referring to FIG. 1, a common component of a monolithic IC is a MOS transistor 100 which is fabricated within or on a semiconductor substrate 102. The scaled down MOS transistor 100 having submicron or nanometer dimensions includes a drain extension region 104 and a source extension region 106 formed within an active device area 126 of the semiconductor substrate 102. The drain extension region 104 and the source extension region 106 are shallow junctions to minimize short-channel effects in the MOS transistor 100 having submicron or nanometer dimensions, as known to one of ordinary skill in the art of integrated circuit fabrication.

The transistor device 100 further includes a drain region 108 and a source region 112. The drain region 108 and the source region 112 are fabricated as deeper junctions such that a relatively large size of a drain silicide and source silicide (not shown), respectively, may be fabricated therein to provide a low resistance contact to the drain and the source, respectively. The drain and source extension junctions 104 and 106 and the drain and source regions 108 and 112 are doped with an N-type dopant for an NMOS (N-channel transistor) and with a P-type dopant for a PMOS (P-channel) device.

The transistor 100 further includes a gate dielectric 116 and a gate electrode 118 which may be polysilicon. A gate silicide (not shown) is formed typically on the polysilicon gate electrode 118 for providing contact to the gate of the device 100. The transistor 100 is electrically isolated from other integrated circuit devices within the semiconductor substrate 102 by, for example, shallow trench isolation structures 121. The shallow trench isolation structures 121 define the active device area 126 within the semiconductor substrate 102, where the MOSFET 100 is fabricated therein.

The device 100 also includes a spacer 122 disposed on the sidewalls of the gate electrode 118 and the gate dielectric 116. When the spacer 122 is comprised of silicon nitride ($Si_3N_4$), then a spacer liner oxide (not shown) may be deposited as a buffer layer between the spacer 122 and the sidewalls of the gate electrode 118 and the gate dielectric 116.

As the dimensions of the transistor 100 are scaled down to tens of nanometers, short-channel effects degrade the performance of the device 100. Short-channel effects that result due to the short length of the channel between the drain extension region 104 and the source extension region 106 are known to one of ordinary skill in the art of integrated circuit fabrication. The electrical characteristics of the transistor 100 become difficult to control with bias on the gate electrode 118 due to short-channel effects which may severely degrade the performance of the MOS device.

Conventionally, the gate dielectric 116 for the MOSFET 100 is typically silicon dioxide ($SiO_2$), and the gate electrode 118 is typically comprised polysilicon. As the channel length and width dimensions of the transistor 100 are scaled down for enhanced speed performance, the thicknesses of the gate dielectric 116 and the gate electrode 118 are also correspondingly scaled down, as known to one of ordinary skill in the art of integrated circuit fabrication. However, as the channel length and width dimensions of the device 100 are scaled down to tens of nanometers, the thickness of the gate dielectric 116 is also scaled down to tens of angstroms when the gate dielectric 116 is silicon dioxide ($SiO_2$). With such a thin gate dielectric 116, charge carriers in some cases easily tunnel through the gate dielectric 116, as known to one of ordinary skill in the art of integrated circuit fabrication.

When charge carriers tunnel through the gate dielectric 116, gate leakage current undesirably increases, resulting in increased static power dissipation and even circuit malfunction. In addition, with charge carriers tunneling through the gate dielectric 116, decreased charge carrier accumulation in the channel of the transistor may result in an undesirable increase in MOSFET channel resistance. Furthermore, with the thin gate dielectric 116, charge accumulation at the gate electrode 118 causes an undesirable increase in charge carrier scattering at the surface of the channel of the device. Such increase in charge carrier scattering in turn results in higher resistance through the channel of the MOSFET and reduced carrier mobility.

In light of the disadvantages of the thin gate dielectric 116 when the gate dielectric 116 is silicon dioxide ($SiO_2$), referring to FIG. 2, a MOS transistor 150 is shown which has a gate dielectric 152 comprised of a dielectric material having a dielectric constant that is higher than the dielectric constant of silicon dioxide ($SiO_2$) (i.e., a high-k dielectric constant material). Device structures having the same reference number in FIGS. 1 and 2 refer to elements having similar structure and function. A dielectric material having a higher dielectric constant has higher thickness for achieving the same capacitance. Thus, when the gate dielectric 152 is comprised of a high-k dielectric constant material, the gate dielectric 152 has a larger thickness (hundreds of angstroms) than when the gate dielectric is comprised of silicon dioxide ($SiO_2$) (tens of angstroms), for field effect transistors having scaled down dimensions of tens of nanometers.

The gate dielectric 152 with a high-k dielectric constant has larger thickness to minimize charge carrier tunneling through the gate dielectric 152 for field effect transistors having scaled down dimensions of tens of nanometers. Charge carrier tunneling through the gate dielectric 152 is minimized exponentially by the thickness of the gate dielectric. Dielectric materials having a dielectric constant that is higher than the dielectric constant of silicon dioxide ($SiO_2$) are known to one of ordinary skill in the art of integrated circuit fabrication.

Although high-k dielectric materials used as gate insulators do act to reduce gate leakage, such materials tend to disadvantageously reduce carrier mobility which negatively impacts transistor speed. Therefore there is a need in the art for further improvements in transistor structure and methods of manufacture.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later. The present invention relates to an improved MOS transistor which exhibits reduced remote scattering in advanced gate insulator device structures.

In accordance with one aspect of the present invention, a MOS transistor is disclosed in which a source and drain region reside in a silicon substrate having a channel region therebetween. A gate insulator resides over the channel region, and the gate insulator comprises a high-k dielectric layer interposed between two thin silicon dioxide layers such as monolayers. A doped polysilicon gate overlies the gate insulator. The thin silicon dioxide layers surrounding the top and bottom surfaces of the high-k dielectric layer provide for a quality interface between the gate insulator and the silicon substrate and the gate insulator and doped polysilicon gate, respectively. The quality interface allows the high-k dielectric layer to improve transistor performance by decreasing gate leakage current without adversely impacting transistor carrier mobility.

In accordance with another aspect of the invention, the MOS transistor comprises a doped polysilicon gate which comprises an interface portion which directly overlies the above gate insulator, and a gate electrode portion that overlies the interface portion. The interface portion and the gate electrode portion of the doped polysilicon gate have different thicknesses and different dopant concentrations. In particular, the interface portion is substantially thinner than the gate electrode portion and has a dopant concentration that is about six or more times less than the gate electrode portion. The customized poly gate doping of the interface portion of the doped polysilicon gate provides improved carrier mobility with little negative impact of poly gate depletion and therefore serves to improve transistor performance over the prior art.

In accordance with yet another aspect of the present invention, a method of forming a MOS transistor having improved carrier mobility is provided. The method comprises forming a gate insulator over a silicon substrate, wherein the gate insulator comprises a high-k dielectric material interposed between the two thin silicon dioxide layers such as monolayers. The thin silicon dioxide layers are formed, for example, using molecular beam epitaxy (MBE) or atomic layer epitaxy (ALE) while the high-k dielectric is formed, for example, by chemical vapor deposition (CVD) or reactive sputtering. A doped polysilicon layer is then formed and patterned to define a gate electrode. Source and drain regions are formed in the silicon substrate, for example, by ion implantation using the poly gate as a mask.

In accordance with another aspect of the present invention, the above method further comprises forming the doped polysilicon layer by separating the formation thereof into two portions. A first polysilicon layer (for example, an interface portion) is formed in contact with the gate insulator with a first dopant concentration and a second polysilicon layer (for example, a gate electrode portion) is formed thereover having a second dopant concentration which is substantially greater than the first dopant concentration. For example, a first polysilicon layer may be deposited and doped in-situ with the first dopant concentration followed by a second poly layer deposition with in-situ doping with the second, greater dopant concentration. Alternatively, a single polysilicon layer is deposited, followed by a first doping at a first energy level and a second doping at a second, lesser energy level. In the above manner, upon activation, a custom poly doping profile is established in the poly gate which reduces carrier mobility degradation due to scattering.

In accordance with still another aspect of the present invention, another MOS transistor is disclosed. The MOS transistor comprises a source and drain region in a silicon substrate having a channel region therebetween. A gate insulator resides over the channel region, and comprises a thin silicon dioxide layer such as a monolayer overlying the silicon substrate and a high-k dielectric layer formed thereover. A high-k metal gate electrode resides over the high-k dielectric, wherein the high-k metal material corresponds to the high-k dielectric material. For example, the high-k dielectric may comprise $HfO_2$ while the high-k metal gate comprises Hf, or the high-k dielectric may comprise $Ta_2O_5$ while the high-k metal gate comprises Ta, respectively. By employing the thin $SiO_2$ layer, a quality interface exists between the substrate and the gate insulator which reduces remote scattering, and thereby improves carrier mobility. In addition, by having the high-k dielectric layer material correspond to the high-k metal material, a quality material interface resides at the gate insulator/gate electrode interface, thereby further improving carrier mobility.

In accordance with yet another aspect of the present invention, a method of forming the MOS transistor above having improved carrier mobility is provided. The method comprises forming a gate insulator over a silicon substrate, wherein the gate insulator comprises a high-k dielectric material overlying a thin silicon dioxide layer such as a monolayer. The thin silicon dioxide layer is formed, for example, using molecular beam epitaxy (MBE) or atomic layer epitaxy (ALE) while the high-k dielectric is formed, for example, by chemical vapor deposition (CVD) or reactive sputtering. A high-k metal layer is then formed over the high-k dielectric layer, wherein the high-k metal material corresponds to the high-k dielectric material, thereby providing a high quality interface between the gate insulator and the metal gate electrode.

In one exemplary aspect of the present invention, the high-k dielectric material is formed via reactive sputtering, followed by a sputtering process in the same chamber, wherein an oxygen content in the environment associated therewith is substantially reduced, thereby facilitating a process where no interfacial layers form at the gate insulator/gate electrode interface.

To the accomplishment of the foregoing and related ends, the invention comprises the features hereinafter fully described. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
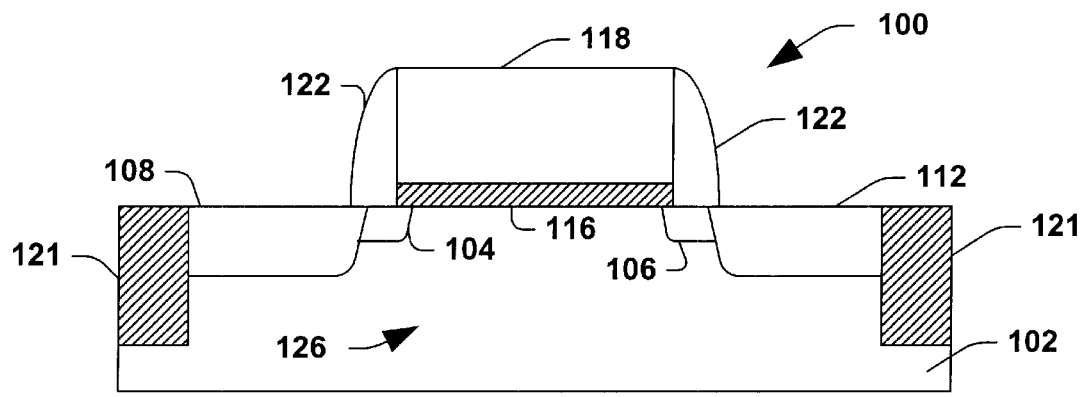
FIG. 1 is a fragmentary cross section diagram illustrating a prior art LDD type MOS transistor employing a traditional gate oxide.
Figure 2:
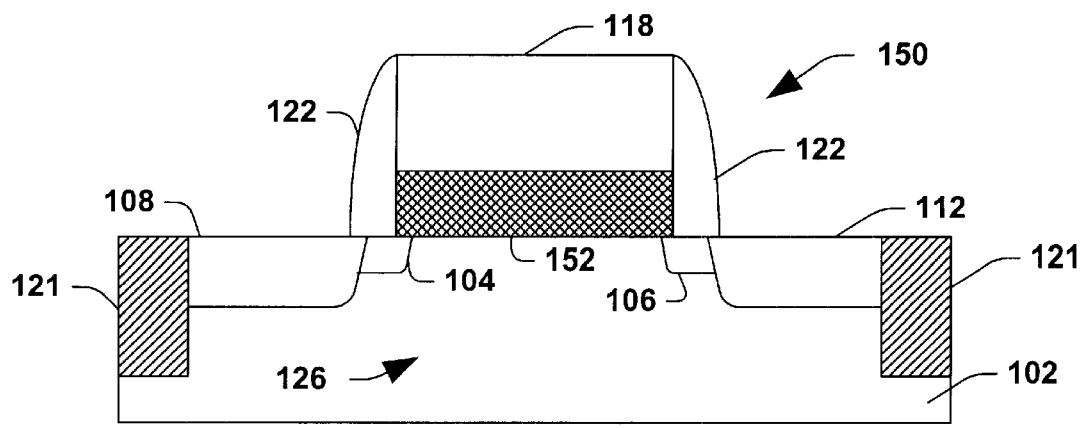
FIG. 2 is a fragmentary cross section diagram illustrating a prior art LDD type MOS transistor employing a high-k dielectric type gate insulator.

The present invention will now be described with reference to the drawings, wherein like reference numerals are used to refer to like elements throughout. The present invention provides a MOS transistor structure and method of manufacture which employs a gate insulator structure which reduces gate leakage current while mitigating the heretofore negative impact of prior art structures on transistor carrier mobility, thereby improving transistor speed.

Figure 3:
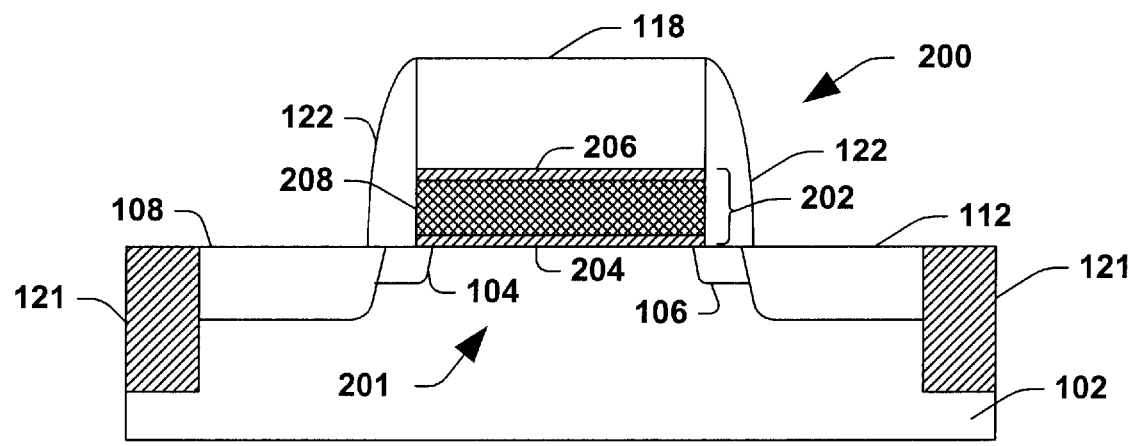
FIG. 3 is a fragmentary cross section diagram illustrating an LDD type MOS transistor employing a gate insulator which reduces leakage current without substantially impacting carrier mobility according to one aspect of the present invention.

Turning now to the figures, FIG. 3 is a fragmentary cross section diagram illustrating an LDD type MOS transistor 200 in accordance with one aspect of the present invention in which source and drain regions 108, 112, extension regions 104, 106 and isolation regions 121 reside in a silicon substrate 102. The source and drain regions 108, 112 (and their associated extension regions, in this example) are laterally separated or spaced apart from one another, thereby defining a channel region 201 therebetween in the silicon substrate. A gate electrode 118, for example, a polysilicon gate electrode, overlies a gate insulator 202 which in turn overlies the channel region 201. In accordance with one aspect of the present invention, the gate insulator 202 comprises two thin silicon dioxide ($SiO_2$) layers 204, 206 having a high-k dielectric material 208 interposed therebetween, as illustrated.

The inventors of the present invention appreciated that although high-k dielectric material gate insulators advantageously allow a physical thickness of the insulator to be increased while maintaining the effective electrical thickness relatively constant (which helps to reduce gate leakage current), the high-k dielectric material disadvantageously reduces transistor carrier mobility. More particularly, the high-k dielectric gate insulator reduces transistor carrier mobility, at least in part, due to the poor interface quality. That is, the inventors of the present invention appreciated that the poor interface at both gate insulator/silicon substrate interface and at the gate insulator/poly gate interface contribute to a substantial reduction in transistor mobility due to the remote scattering effect.

The thin $SiO_2$ layer 204 provides a high quality interface to the channel portion 201 of the silicon substrate 102 because silicon and $SiO_2$ form a good bond. In contrast, a bonding of silicon to nitride or other high-k type materials is poor and such poor interface quality leads to scattering which disadvantageously reduces transistor carrier mobility. In contrast, $SiO_2$ forms a good bond with both the silicon substrate and the nitride material (and other high-k materials) thereabove as illustrated in FIG. 3, and therefore $SiO_2$ advantageously provides a smooth material transition as opposed to an abrupt transition. Therefore the gate insulator 202 operates to reduce the remote scattering which negatively impacts carrier mobility.

In accordance with one aspect of the present invention, the thickness of the thin $SiO_2$ layers 204, 206 are made as thin as possible, and preferably are monolayers. In the past, when prior art gate insulators were fabricated, interfacial oxides were sometimes formed and such interfacial layers (e.g., having a thickness of about 10 Angstroms or more) were undesirable, and substantial efforts were made to eliminate such layers. In accordance with the present invention, the $SiO_2$ interface layers 204, 206 are thin and such term is defined as being an $SiO_2$ thickness less than that of an interfacial oxide (e.g., about 10 Angstroms), and preferably a monolayer which is a thickness of a single $SiO_2$ molecule (e.g., about 2 Angstroms or less).

The reason a thickness of the $SiO_2$ layers 204, 206 is important is as follows. With a gate insulator stack 202 as shown in FIG. 3, the effective capacitance (Ceff) of the stack 202 can be determined by:

$$1/\text{Ceff} = 1/C_{SiO2(bottom)} + 1/C_{high-k} + 1/C_{SiO2(top)}.$$

Since C=k/d for each layer in the stack, the contributory capacitance can be ascertained if the thicknesses (d) are known. If, for example, each $SiO_2$ layer is as thick as the high-k layer 208 (e.g., d=10 Angstroms) and $k_{SiO2}$=4 and $k_{high-k}$=30, then Ceff (ignoring units) can be calculated:

$$1/\text{Ceff} = 10/4 + 10/30 + 10/4 = 5.33, \text{ therefore Ceff} = 0.1875.$$

With Ceff and $d_{total}$ known (30 Angstroms), an effective dielectric constant for the gate insulator can be determined, which is $k_{eff}$=5.6. Since k for $SiO_2$ is about 4, the high-k material provides very little improvement over a traditional $SiO_2$ gate oxide. Alternatively, if $SiO_2$ layers 204, 206 are small as in the present invention (e.g., about 2 Angstroms), then after performing similar calculations to that performed above (with a high-k thickness of 10 Angstroms), the effective dielectric constant of the stack 202 is $k_{eff}$=10.5, resulting in almost a 2×increase in the dielectric constant compared to the previous example.

In addition to a high quality silicon substrate/gate insulator interface, the top thin $SiO_2$ layer 206 also operates to provide a high quality interface between the gate insulator and the poly gate 118, and therefore further operates to improve carrier mobility.

Figure 4:
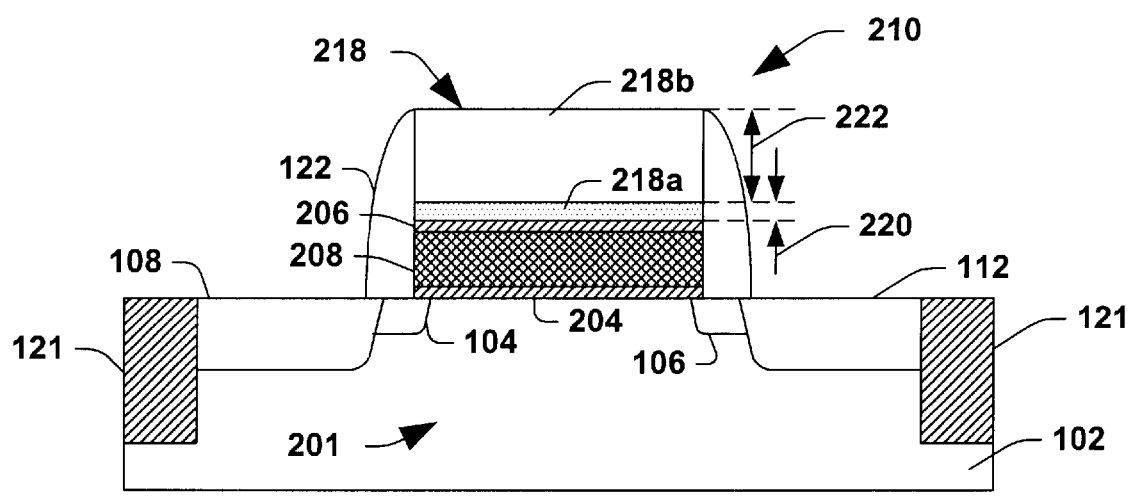
FIG. 4 is a fragmentary cross section diagram illustrating an LDD MOS type transistor employing the gate insulator of FIG. 3, and further incorporating a poly gate electrode having a custom interface portion at the gate insulator interface for further improving transistor mobility according to another aspect of the present invention.

In accordance with another aspect of the present invention, the gate insulator 202 of FIG. 3 may be incorporated into another MOS transistor such as the transistor 210 of FIG. 4. The transistor 210 is similar in some respects to the transistor 200 of FIG. 3, having source/drain regions 108, 112, extension regions 104, 106, isolation regions 121, the gate insulator 202, and sidewall spacers 122. The transistor 210, however, has a doped polysilicon gate 218 that has two portions: an interface portion 218a overlying the gate insulator 202, and a gate electrode portion 218b that overlies the interface portion 218a. The gate electrode 218 is customized to exhibit a dopant profile that reduces scattering (e.g., coulomb scattering) and thus improves transistor carrier mobility.

In one example, the interface portion 218a of the poly gate has a thickness 220 and a dopant concentration that is substantially less than that of the gate electrode portion 218b. For example, the interface portion 218a has a thickness of about 30 Angstroms or more and about 60 Angstroms or less, whereas the gate electrode portion 218b is substantially thicker, having a thickness 222 of about 300 Angstroms or more and about 1,000 Angstroms or less. In addition, the dopant concentration of the interface portion 218a has a dopant concentration that is about six times less than that of the gate electrode portion 218b, for example, about $1 \times 10^{19}$ atoms/cm$^3$ compared to the gate electrode portion having a dopant concentration of about $6 \times 10^{19}$ atoms/cm$^3$ or more.

The customized poly gate 218 of FIG. 4 has a lower dopant concentration in the interface portion 218a near the gate insulator 202, which reduces coulomb scattering, however, the dopant concentration of the interface portion is not low enough to contribute significantly to poly depletion, thus providing improved carrier mobility without any substantially negative impact associated with poly depletion. In addition, the interface portion 218a of the poly gate 218 is thin enough to not substantially impact the gate resistance of the transistor 210.

In accordance with yet another aspect of the present invention, a method of forming a MOS transistor having a gate insulator 202 as illustrated in FIGS. 3 and 4, will be described in conjunction with FIG. 5, as illustrated at reference numeral 300. While the method 300 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the methods according to the present invention may be implemented in association with the apparatus and systems illustrated and described herein as well as in association with other systems not illustrated.

The method 300 begins at 302, and a first, thin silicon dioxide ($SiO_2$) is formed over a silicon substrate at 304. In accordance with the present example, the thin $SiO_2$ film is less than about 10 Angstroms, and preferably is a monolayer of about 2 Angstroms or less. In accordance with one example, the thin $SiO_2$ film is formed via molecular beam epitaxy (MBE) or atomic layer epitaxy or deposition (ALE), although other methods of forming the thin $SiO_2$ film may be employed and any such formation technique is contemplated as falling within the scope of the present invention.

For example, using MBE, the silicon substrate is placed in a deposition chamber, preferably in an ultra-high vacuum environment. Effusion cells which provide the source material (containing oxygen) are preferably controlled by one or more shutters operable to be shuttered in a fraction of a second so that the growth rate of about a few Angstroms/ second can be tightly controlled. In addition, to maintain control, the silicon substrate is cleaned (e.g., wet/dry cleaned or deoxidation) prior to MBE deposition to remove any interfacial oxide on the silicon substrate surface, and such cleaning may be performed either outside or inside the deposition chamber.

The method 300 continues at 306, wherein a high-k material dielectric layer is formed over the first thin $SiO_2$ layer. For example, the high-k dielectric material may be formed using chemical vapor deposition (CVD), reactive sputtering, ALE or MBE, however, any manner of forming a high-k film may be employed and such alternatives are contemplated as falling within the scope of the present invention. Generally speaking, a high-k dielectric material is any material having a dielectric constant which is greater than $SiO_2$ which is about 4.0. Therefore in the present invention, a high-k material may comprise materials such as SiNx which has a dielectric constant between about 4–10, $Ta_2O_5$, $Al_2O_3$, $TiO_2$, $HfO_2$, or $ZrO_2$, which have dielectric constants between about 10–100, and even ultra high dielectric constant materials such as PZT or BST which have dielectric constants greater than 100. All such dielectric materials are contemplated as falling within the scope of the present invention. In the above example, the high-k material is formed at 306 to a thickness of about 5 Angstroms or more, and preferably 10 Angstroms or more.

Figure 5:
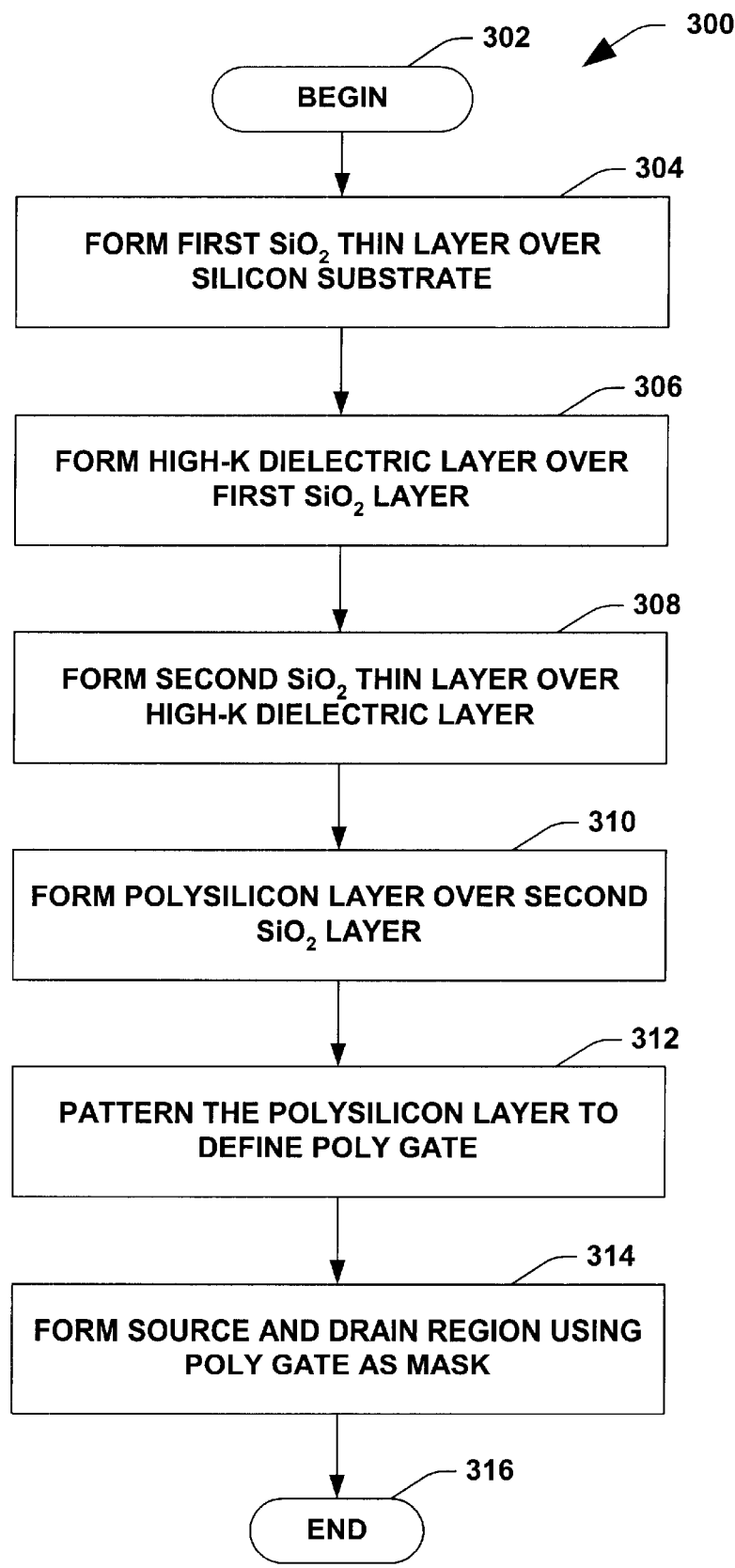
FIG. 5 is a flow chart diagram illustrating a method of forming a MOS transistor having reduced leakage current without substantially reducing transistor mobility in accordance with yet another aspect of the present invention.

The method 300 of FIG. 5 continues at 308 with the formation of a second thin $SiO_2$ film over the high-k dielectric. As in 304, the second thin $SiO_2$ film may be formed in a similar manner to form a high quality thin layer (e.g., about 10 Angstroms or less) and preferably a monolayer (e.g., about 2 Angstroms or less). A polysilicon layer is then formed over the second thin $SiO_2$ layer at 310, for example, using CVD, however, any deposition process may be employed (such as MBE, sputtering, ALE, etc.) and is contemplated as falling within the scope of the present invention. The polysilicon layer is preferably doped and such doping may be performed in-situ or subsequent to deposition using, for example, ion implantation.

In one exemplary aspect of the present invention, the polysilicon formation at 310 may be a multi-step process to form a polysilicon film having two portions similar to that shown in FIG. 4 and described in conjunction therewith. For example, 310 may comprise a first polysilicon deposition process, wherein an interface polysilicon layer is formed over the second thin $SiO_2$ layer to a first thickness (for example, about 30–60 Angstroms) and doped in-situ with a first dopant concentration of, for example, about $1 \times 10^{19}$ atoms/cm$^3$. A second polysilicon deposition can then be performed to form a gate electrode layer having a second thickness (e.g., about 300–1000 Angstroms) and doped in-situ with a second dopant concentration of, for example, about $6 \times 10^{19}$ atoms/cm$^3$.

Alternatively, the interface layer may be formed and doped via ion implantation to the first dopant concentration followed by the formation of the gate electrode layer which is then doped via ion implantation to the second dopant concentration. In yet another alternative, a single polysilicon layer may be formed which is followed by two separate ion implantation steps, with the first implantation at a lower dose and high energy to drive dopant down to the interface portion. A second implantation is then performed with a second, lower energy which drives dopant through the gate electrode portion without extending down to the interface portion to thereby generate a customized dopant profile therein. Any manner of forming a custom doped poly gate layer may be employed and is contemplated as falling within the scope of the present invention.

Continuing at 312, the polysilicon layer is patterned to define a polysilicon gate. For example, such pattering may be performed in accordance with traditional lithographic processes, followed by an etch, for example, a generally anisotropic reactive ion etch (RIE). Any manner of patterning the poly gate, however, may be employed and all such alternatives are contemplated as falling within the scope of the present invention.

The method 300 continues at 314, wherein the source/drain regions are formed. In accordance with one exemplary aspect of the present invention, the source/drain regions are formed after definition of the poly gate via ion implantation, wherein the poly gate is used as a mask to form self-aligned source/drain regions in the silicon substrate. Alternatively, the source/drain regions may be formed via ion implantation prior to the formation processes at 304, 306, 308, 310 and 312, respectively, such that the above acts occur subsequent to the source/drain formation, as may be desired. In yet another alternative aspect of the present invention, an LDD type MOS device may be formed by employing an extension region implant using the patterned poly gate as mask, followed by the formation of sidewall spacers on the poly gate sidewalls in accordance with conventional formation techniques. Subsequently, source/drain regions are then formed via ion implantation using the poly gate and sidewall spacers as a mask, wherein the source/drain regions along with their corresponding extension regions are self-aligned. The method 300 then ends at 316.

Figure 6:
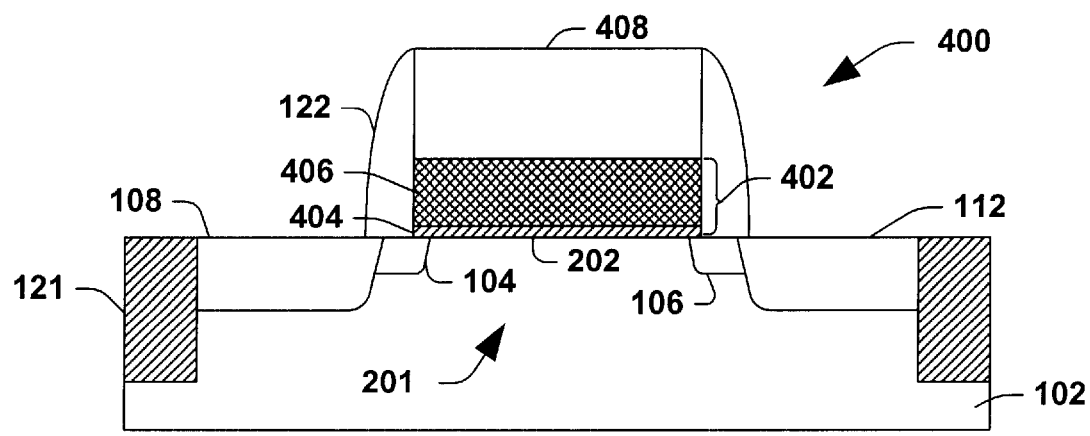
FIG. 6 is a fragmentary cross section diagram illustrating an LDD type MOS transistor having a gate insulator and metal gate structure which reduces leakage without substantially impacting transistor mobility in accordance with still another aspect of the present invention.

In accordance with still another aspect of the present invention, another MOS type transistor which reduces leakage current by employing high-k dielectric materials with substantially impacting transistor carrier mobility in a negative manner is illustrated in FIG. 6, as indicated at reference numeral 400. The transistor 400 is similar in some respects to the transistor 200 of FIG. 3, having source/drain regions 108, 112, extension regions 104, 106, isolation regions 121, and sidewall spacers 122. The transistor 400, however, has a different type of gate insulator 402 which comprises a thin $SiO_2$ interface layer 404 overlying the channel region 201 of the silicon substrate, and a high-k dielectric material layer 406 disposed thereover.

The $SiO_2$ interface layer 404 advantageously provides a good material match to the underlying silicon and to the overlying high-k dielectric material layer 406. Such a quality interface reduces remote scattering and thereby improves carrier mobility over prior art type devices employing high-k dielectrics. As discussed above, the $SiO_2$ interface layer 404 is thinner than interfacial type oxide layers (e.g., about 10 Angstroms or less), and is preferably a monolayer (e.g., about 2 Angstroms or less) and thus advantageously reduces scattering without substantially reduces the effective dielectric constant of the gate insulator 402 ($k_{eff}$).

A high-k metal type metal gate electrode 408 is disposed over the gate insulator 402, as illustrated in FIG. 6. The high-k metal gate electrode 408 comprises a high-k metal material that corresponds to the high-k dielectric material employed in the gate insulator 402, and thus provides an excellent quality interface without the necessity of another thin $SiO_2$ layer, which allows for the dielectric constant of the gate insulator 402 to be advantageously maximized.

In accordance with the present invention, a high-k metal material which corresponds to the high-k dielectric material in the gate insulator means that if the high-k dielectric is, for example, $Ta_2O_5$, then the corresponding high-k metal material is Ta. Similarly, if the high-k dielectric material is $TiO_2$ or $HfO_2$, then the corresponding high-k metal gate material would be Ti or Hf, respectively. By having the corresponding high-k metal employed, the interface between the high-k dielectric material layer 406 and the high-k metal gate layer 408 is a high quality interface, which reduces remote scattering. In the above manner, the transistor 400 of FIG. 6 advantageously provides a high dielectric constant gate insulator 402 which can have a substantial physical thickness to reduce gate current leakage while concurrently reducing remote scattering, which advantageously improves the transistor carrier mobility.

Figure 7:
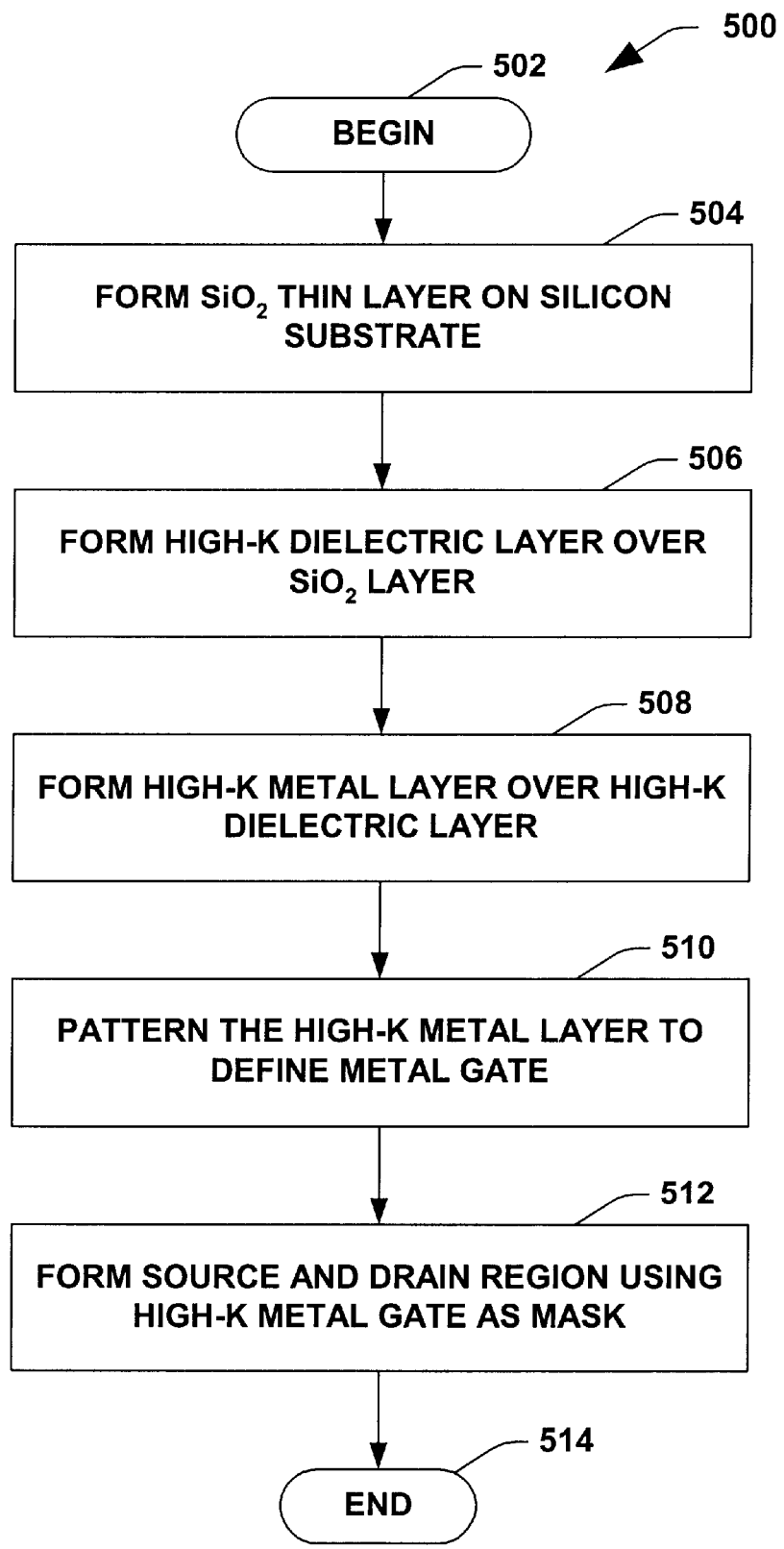
FIG. 7 is a flow chart diagram illustrating a method of forming a MOS transistor having a gate insulator and metal gate structure which reduces leakage current without substantially impacting transistor mobility in accordance with yet another aspect of the present invention.

Turning now to FIG. 7, a method of making the transistor 400 of FIG. 6 is provided, and is designated at reference numeral 500. While the method 500 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the methods according to the present invention may be implemented in association with the apparatus and systems illustrated and described herein as well as in association with other systems not illustrated.

The method 500 begins at 502, and a first, thin silicon dioxide ($SiO_2$) is formed over a silicon substrate at 504. In accordance with the present example, the thin $SiO_2$ film is less than about 10 Angstroms, and preferably is a monolayer of about 2 Angstroms or less. In accordance with one example, the thin $SiO_2$ film is formed via molecular beam epitaxy (MBE) or atomic layer epitaxy or deposition (ALE), although other methods of forming the thin $SiO_2$ film may be employed and any such formation technique is contemplated as falling within the scope of the present invention.

For example, using MBE, the silicon substrate is placed in a deposition chamber, preferably in an ultra-high vacuum environment. Effusion cells which provide the source material (containing oxygen) are preferably controlled by one or more shutters operable to be shuttered in a fraction of a second so that the growth rate of about a few Angstroms/second can be tightly controlled. In addition, to maintain control, the silicon substrate is cleaned (e.g., wet/dry cleaned or deoxidation) prior to MBE deposition to remove any interfacial oxide on the silicon substrate surface, and such cleaning may be performed either outside or inside the deposition chamber.

The method 500 continues at 506, wherein a high-k material dielectric layer is formed over the first thin $SiO_2$ layer. For example, the high-k dielectric material may be formed using chemical vapor deposition (CVD), reactive sputtering, ALE or MBE, however, any manner of forming a high-k film may be employed and such alternatives are contemplated as falling within the scope of the present invention. Generally speaking, a high-k dielectric material is any material having a dielectric constant which is greater than $SiO_2$ which is about 4.0. Therefore in the present invention, a high-k material may comprise materials such as SiNx which has a dielectric constant between about 4–10, $Ta_2O_5$, $Al_2O_3$, $TiO_2$, $HfO_2$, or $ZrO_2$, which have dielectric constants between about 10–100, and even ultra high dielectric constant materials such as PZT or BST which have dielectric constants greater than 100. All such dielectric materials are contemplated as falling within the scope of the present invention. In the above example, the high-k material is formed at 306 to a thickness of about 10 Angstroms or more.

The method 500 of FIG. 7 continues at 508 with the formation of a high-k metal gate electrode layer over the high-k dielectric layer at 508, for example, using chemical vapor deposition (CVD), reactive sputtering, ALE or MBE;

however, any manner of forming a high-k film may be employed and such alternatives are contemplated as falling within the scope of the present invention.

In one exemplary aspect of the present invention, acts 506 and 508 are performed in the same processing chamber and are formed via reactive sputtering and sputtering, respectively. For example, in forming the high-k dielectric layer, a reactive sputtering process is employed in which a high-k metal material target is bombarded with ions in an oxidizing environment (e.g., in the presence of at least oxygen). In the above manner, a high-k dielectric film is formed using the high-k material target. The high-k metal gate electrode layer may then be formed by reducing or preferably eliminating the oxidizing environment in the process chamber such that a film composed of the high-k metal is formed. In the above, manner, a clean interface may be obtained between the high-k gate dielectric layer and the high-k metal gate electrode layer.

Continuing at 510, the high-k metal gate layer is patterned to define a high-k metal gate electrode. For example, such pattering may be performed in accordance with traditional lithographic processes, followed by an etch, for example, a generally anisotropic reactive ion etch (RIE). Any manner of patterning the high-k metal gate, however, may be employed and all such alternatives are contemplated as falling within the scope of the present invention.

The method 500 continues at 512, wherein the source/drain regions are formed. In accordance with one exemplary aspect of the present invention, the source/drain regions are formed after definition of the poly gate via ion implantation, wherein the poly gate is used as a mask to form self-aligned source/drain regions in the silicon substrate. Alternatively, the source/drain regions may be formed via ion implantation prior to the formation processes at 504, 506, 508, and 510, respectively, such that the above acts occur subsequent to the source/drain formation, as may be desired. In yet another alternative aspect of the present invention, an LDD type MOS device may be formed by employing an extension region implant using the patterned poly gate as mask, followed by the formation of sidewall spacers on the poly gate sidewalls in accordance with conventional formation techniques. Subsequently, source/drain regions are then formed via ion implantation using the poly gate and sidewall spacers as a mask, wherein the source/drain regions along with their corresponding extension regions are self-aligned. The method 500 then ends at 514.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:
1. A MOS transistor, comprising:
a source and drain region formed in a semiconductor substrate, and defining a channel region therebetween;
a gate insulator directly overlying the channel region, wherein the gate insulator comprises:
a first thin silicon dioxide layer directly overlying the channel region;
a high-k material layer overlying the first thin silicon dioxide layer;
a second thin silicon dioxide layer overlying the high-k material layer; and
a doped polysilicon gate overlying the gate insulator.

2. A MOS transistor, comprising:
a source and drain region formed in a semiconductor substrate, and defining a channel region therebetween;
a gate insulator overlying the channel region, wherein the gate insulator comprises:
a first thin silicon dioxide layer directly overlying the channel region;
a high-k material layer overlying the first thin silicon dioxide layer;
a second thin silicon dioxide layer overlying the high-k material layer,
wherein the first and second thin silicon dioxide layers are monolayers; and
a doped polysilicon gate overlying the gate insulator.

3. A MOS transistor, comprising:
a source and drain region formed in a semiconductor substrate, and defining a channel region therebetween;
a gate insulator overlying the channel region, wherein the gate insulator comprises:
a first thin silicon dioxide layer directly overlying the channel region;
a high-k material layer overlying the first thin silicon dioxide layer;
a second thin silicon dioxide layer overlying the high-k material layer; and
a second thin silicon dioxide layer overlying the high-k material layer; and
a doped polysilicon gate overlying the gate insulator, wherein the doped polysilicon gate comprises:
an interface portion overlying the second thin silicon dioxide layer; and
a gate electrode portion overlying the interface portion, wherein a dopant concentration of the interface portion of the doped polysilicon gate is less than a dopant concentration of the gate electrode portion of the doped polysilicon gate.

4. The MOS transistor of claim 3, wherein the dopant concentration of the interface portion of the doped polysilicon gate is at least six times less than the dopant concentration of the gate electrode portion.

5. The MOS transistor of claim 3, wherein the interface portion of the doped polysilicon gate has a dopant concentration of about $1 \times 10^{19}$ atoms/cm$^3$ or less.

6. The MOS transistor of claim 5, wherein the gate electrode portion of the doped polysilicon gate has a dopant concentration of about $6 \times 10^{19}$ atoms/cm$^3$ or more.

7. The MOS transistor of claim 3, wherein the gate electrode portion of the doped polysilicon gate has a thickness of about 300 Angstroms or more and about 1000 Angstroms or less.

8. The MOS transistor of claim 7, wherein the interface portion of the doped polysilicon gate has a thickness of about 30 Angstroms or more and about 60 Angstroms or less.

9. A MOS transistor, comprising:

a source and drain region formed in a semiconductor substrate and defining a channel region therebetween;

a gate insulator formed over the channel region on a surface of the semiconductor substrate, wherein the gate insulator comprises:
 a thin silicon dioxide layer directly overlying the channel region;
 a high-k dielectric material overlying the thin silicon dioxide layer; and a high-k metal gate electrode overlying the gate insulator, wherein the high-k metal corresponds to the high-k dielectric material.

10. The MOS transistor of claim 9, wherein the thin silicon dioxide layer consists of a monolayer.

11. The MOS transistor of claim 9, wherein the high-k dielectric material comprises $TiO_2$, and the high-k metal comprises Ti.

12. The MOS transistor of claim 9, wherein the high-k dielectric material comprises $Ta_2O_5$, and the high-k metal comprises Ta.

13. The MOS transistor of claim 9, wherein the high-k dielectric material comprises $Al_2O_3$, and the high-k metal comprises Al.

14. The MOS transistor of claim 9, wherein the high-k dielectric material comprises $HfO_2$, and the high-k metal comprises Hf.

* * * * *